(12) United States Patent
Berzins et al.

(10) Patent No.: US 7,683,697 B2
(45) Date of Patent: Mar. 23, 2010

(54) CIRCUITRY AND METHOD FOR BUFFERING A POWER MODE CONTROL SIGNAL

(75) Inventors: Matthew S. Berzins, Cedar Park, TX (US); Charles A. Cornell, Austin, TX (US); Andrew P. Hoover, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 97 days.

(21) Appl. No.: 12/130,590

(22) Filed: May 30, 2008

(65) Prior Publication Data
US 2009/0295467 A1 Dec. 3, 2009

(51) Int. Cl.
*H03K 3/01* (2006.01)
(52) U.S. Cl. ..................................... 327/534
(58) Field of Classification Search ................. 327/534, 327/535, 537, 544
See application file for complete search history.

(56) References Cited

U.S. PATENT DOCUMENTS 6,356,119 B2    3/2002  Horiguchi et al.
6,373,321 B1 *  4/2002  Yamauchi et al. ............ 327/534
6,600,360 B2 *  7/2003  Mizuno et al. ............... 327/534
7,123,068 B1   10/2006  Hoover et al.
7,391,232 B1 *  6/2008  Bose et al. ..................... 326/33
2005/0213414 A1 9/2005  Horiguchi et al.

OTHER PUBLICATIONS

Goering, Richard; "Low-power IC design techniques may perturb the entire flow"; May 7, 2007; 4 pages; EETimes.com.

* cited by examiner

Primary Examiner—Jeffrey S Zweizig
(74) Attorney, Agent, or Firm—Joanna G. Chiu; Robert L. King

(57) ABSTRACT

A circuit has an input for receiving a power mode control signal to indicate a low power mode. A plurality of non-inverting buffers forms a fanout signal distribution network and provides buffering of the power mode control signal for gated power domain functional circuitry. Each non-inverting buffer has an even number of serially-connected inverting gates, at least a portion providing respective outputs having a valid logic state in the low power mode. Two voltages are used, one of which is disconnected during the low power mode. The non-inverting buffers have a first inverting gate connected to a continuous voltage terminal and a second inverting gate, collectively sized larger than the first inverting gate and connected to a voltage terminal which is selectively disconnected during the low power mode from the continuous voltage terminal.

20 Claims, 4 Drawing Sheets

CIRCUITRY AND METHOD FOR BUFFERING A POWER MODE CONTROL SIGNAL

BACKGROUND

1. Field

This disclosure relates generally to buffering, and more specifically, to buffering a power mode control signal.

2. Related Art

In power-gated systems, a power mode control signal is used to cause functional circuitry to enter a low power mode. This power mode control signal is typically distributed to various elements of the functional circuitry through the use of a fanout signal distribution network used for buffering the signal. Since the power mode control signal must remain valid during low power mode, each gate in the signal distribution network remains powered during the low power mode. However, leakage current from this always-on signal distribution network is a significant contribution to the standby current. This may, for example, result in reduced battery life for portable devices.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

Figure 1:
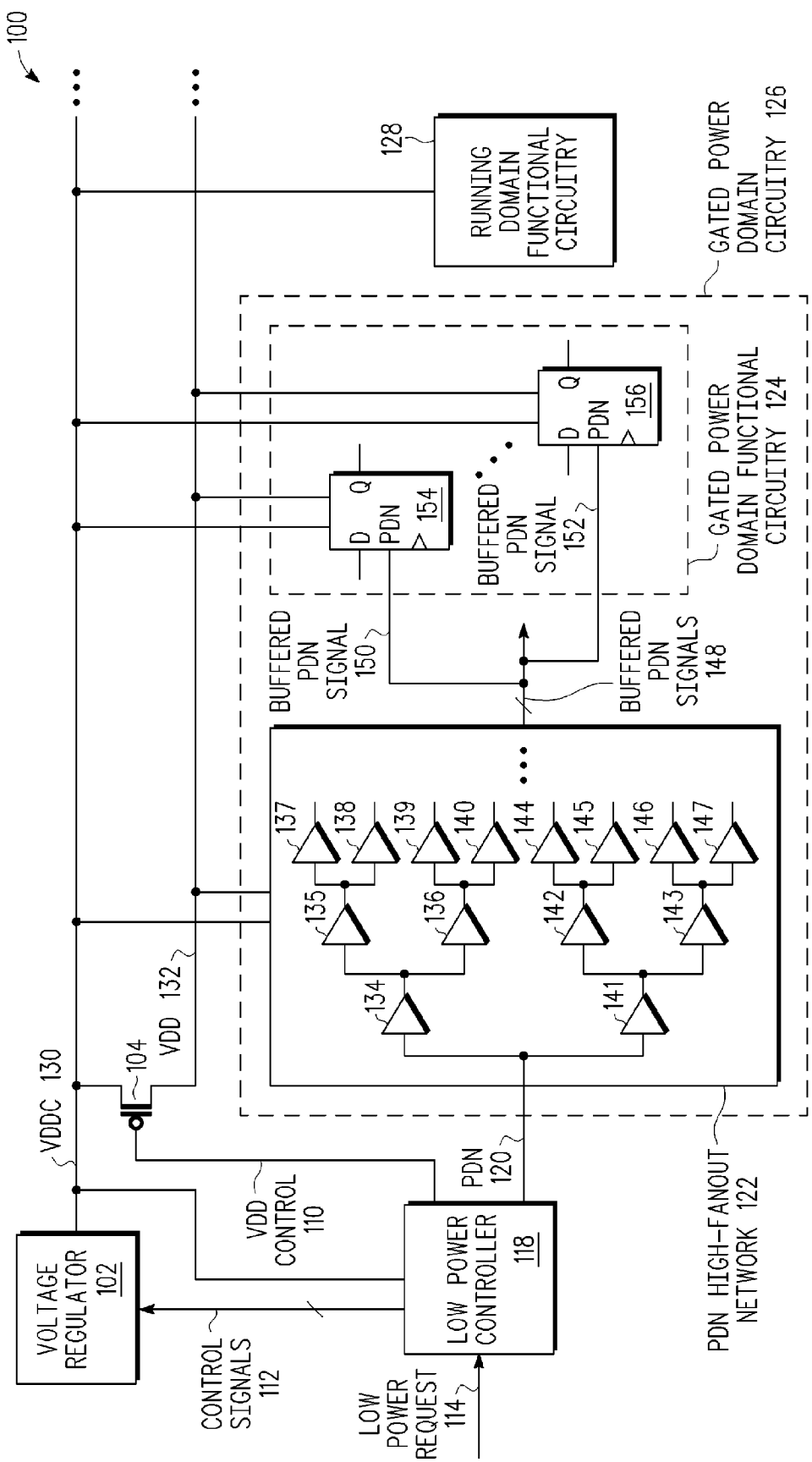
FIG. 1 illustrates, in block diagram form, a system in accordance with one embodiment of the present invention.

In power-gated systems, a power mode control signal is typically used to cause functional circuitry to enter a low power mode. This power mode control signal is typically distributed to various elements of the functional circuitry through the use of a fanout signal distribution network for buffering the signal. In one embodiment, the fanout signal distribution network includes a number of non-inverting buffers, each non-inverting buffer including an even number of inverting gates. In one embodiment, both a continuous voltage supply and a gated (i.e. non-continuous) voltage supply are provided to the fanout signal distribution network, such that, during a low power mode, some of the inverting gates (e.g. those which are powered by the gated voltage supply) may be powered down. In this manner, leakage current (e.g. subthreshold leakage current) of the fanout signal distribution network can be reduced. This may therefore result in improved battery life.

As used herein, the term "bus" is used to refer to a plurality of signals or conductors which may be used to transfer one or more various types of information, such as data, addresses, control, or status. The conductors as discussed herein may be illustrated or described in reference to being a single conductor, a plurality of conductors, unidirectional conductors, or bidirectional conductors. However, different embodiments may vary the implementation of the conductors. For example, separate unidirectional conductors may be used rather than bidirectional conductors and vice versa. Also, plurality of conductors may be replaced with a single conductor that transfers multiple signals serially or in a time multiplexed manner. Likewise, single conductors carrying multiple signals may be separated out into various different conductors carrying subsets of these signals. Therefore, many options exist for transferring signals.

The terms "assert" or "set" and "negate" (or "deassert" or "clear") are used herein when referring to the rendering of a signal, status bit, or similar apparatus into its logically true or logically false state, respectively. If the logically true state is a logic level one, the logically false state is a logic level zero. And if the logically true state is a logic level zero, the logically false state is a logic level one. Each signal described herein may be designed as positive or negative logic, where negative logic can be indicated by a bar over the signal name, an asterix (*) following the name, or an "N" following the name. In the case of a negative logic signal, the signal is active low where the logically true state corresponds to a logic level zero. In the case of a positive logic signal, the signal is active high where the logically true state corresponds to a logic level one. Note that any of the signals described herein can be designed as either negative or positive logic signals. Therefore, in alternate embodiments, those signals described as positive logic signals may be implemented as negative logic signals, and those signals described as negative logic signals may be implemented as positive logic signals.

Brackets are used herein to indicate the conductors of a bus or the bit locations of a value. For example, "bus 60 [7:0]" or "conductors [7:0] of bus 60" indicates the eight lower order conductors of bus 60, and "address bits [7:0]" or "ADDRESS [7:0]" indicates the eight lower order bits of an address value. The symbol "$" preceding a number indicates that the number is represented in its hexadecimal or base sixteen form. The symbol "%" preceding a number indicates that the number is represented in its binary or base two form.

FIG. 1 illustrates a data processing system 100 in accordance with one embodiment of the present invention. System 100 includes a voltage regulator 102, a power supply switch 104, a low power controller 118, gated power domain circuitry 126, and running domain functional circuitry 128. Gated power domain circuitry 126 includes a PDN high-fanout network 122 (which may also be referred to as a fanout signal distribution network or a signal distribution network) and gated power domain functional circuitry 124. (Note that, in one embodiment, as will be described further below, PDN refers to a power mode control "power down" active low signal.) Gated power domain functional circuitry 124 includes any number of elements which may be powered down. For example, in the illustrated embodiment, gated power domain functional circuitry 124 includes a plurality of storage elements, such as flip flops 154 and 156. Each of flip flops 154 and 156 is capable of retaining state when Vdd is powered down. This is controlled via a PDN input. In one embodiment, flip flops 154 and 156 are referred to as state retention registers. PDN high-fanout network 122 includes a plurality of non-inverting buffers 134-147 coupled in a fanout configuration and providing a plurality of buffered PDN signals 148. Each of the buffered PDN signals 148 may be provided to a circuit element in gated power domain function circuitry 124 that can be powered down. For example, a first buffered PDN signal 150 of buffered PDN signals 148 may be provided to the PDN input of flip flop 154 and a second buffered PDN signal 152 of buffered PDN signals 148 may be provided to the PDN input of flip flop 156.

Note that, in the illustrated embodiment, PDN high-fanout network 122 has a fanout of 2, where each non-inverting buffer output is coupled to the inputs of two non-inverting buffers. However, in alternate embodiments, any fanout configuration may be used. For example, high-fanout network 122 may have a fanout of N (where N is an integer greater than or equal to 2). Furthermore, high-fanout network 122 may be asymmetrical, where some branches are shorter than others or where different stages fan out to a different number of non-inverting buffers. Some stages of such an asymmetrical network may have fanout of 1. Also, note that although FIG. 1 illustrates each stage as having only one non-inverting buffer, in alternate embodiments, each stage or a portion of the stages, may include any number of non-inverting buffers coupled in series.

Voltage regulator 102 provides continuous VDD (VDDC) 130 where VDDC 130 and VDD 132 are coupled via power supply switch 104. In the illustrated embodiment, power supply switch 104 is implemented by a P-channel transistor; however, alternate embodiments may use different switching mechanisms to perform the functionality of power supply switch 104. Note that for ease of explanation, power supply switch 104 will be referred to as transistor 104 herein. Referring to FIG. 1, a first current electrode of transistor 104 is coupled to VDDC 130, a second current electrode of transistor 104 is coupled to VDD 132, and a control electrode of transistor 104 is coupled to receive a power switch control signal (VDD control 110) from low power controller 118. VDDC 130 is provided to low power controller 118, gated power domain circuitry 126, and running domain functional circuitry 128. VDD 132 is provided to gated power domain circuitry 126. Low power controller 118 receives a low power request signal 114 and provides a power mode control signal (PDN 120) to gated power domain circuitry 126. Low power controller 118 also provides control signals 112 to voltage regulator 102. Note that system 100 may be located all on a same integrated circuit, or, alternatively, system 100 may be located on any number of integrated circuits or may be implemented with both integrated circuit elements and discrete circuit elements. System 100 may be any type of data processing system, such as, for example, a microprocessor, digital signal processor, etc., or any type of information processing system. Also note that in the illustrated embodiment of system 100, VDD control 110 and low power request 114 are described as positive logic signals (i.e. active high signals) and PDN 120 is described as a negative logic signal (i.e. an active low signal). In the illustrated embodiment, VDD control 110 being described as a positive logic signal means that a logic high turns off switch 104.

Note that, as illustrated in FIG. 1, a power mode control signal, PDN 120, is buffered via fanout network 122 and provided to state retention registers, such as flip flops 154 and 156. However, note that the descriptions provided herein for PDN 120 and fanout network 122 apply to any power mode control signal, such as any signal which indicates a low power mode of system 100 or of any portion of system 100 (such as gated power domain circuitry 126). For example, power mode control signals may be used to control state retention registers (as illustrated in FIG. 1), to control isolation logic, or as an input to embedded memory control pins. In response to their corresponding power mode control signal, these registers, isolation logic, or embedded memory may prepare for a low power mode. In each of these cases, a signal distribution network may be used to buffer the power mode control signal, where the descriptions of fanout network 122 and non-inverting buffers 134-147 would also apply to any signal distribution network for any power mode control signal. Therefore, note that buffered PDN signals 148 may also be referred to as power mode control signals. Also, note that since power mode control signals may be used to indicate a low power mode, their values need to be valid during low power mode itself. For example, as illustrated in FIG. 1, the buffered PDN signals 148 are provided to power mode inputs (e.g. PDN inputs) of flip flops 154 and 156 which control configuration and operation of flip flops 154 and 156 during low power mode, and thus need to provide a valid logic value during low power mode.

In operation, system 100 includes VDDC 130 (which may also be referred to as a continuous power supply signal) and VDD 132 (which may also be referred to as a gated or non-continuous power supply signal) to provide power to various portions of system 100. In the illustrated embodiment, VDDC 130 is generated by voltage regulator 102, as known in the art, such that VDDC 130 is a controllably regulated power supply signal. When VDD 132 is coupled to VDDC 130 (via transistor 104, when VDD control 110 is a logic level 0), then VDD 132 is approximately the same as VDDC 130, and both provide power to portions of system 100. When VDD control 110 is a logic level 1, then VDD 132 is decoupled from VDDC 130, such that only VDDC 130 provides power to portions of system 100, thus power gating VDD 132 (i.e. removing power to those portions of circuitry coupled to VDD 132). Note that in alternate embodiments, different circuitry may be used to implement the functionality of transistor 104 such that, depending on VDD control 110, either both VDDC 130 and VDD 132 provide power to system 100, or VDDC 130, but not VDD 132, provides power to system 100. For example, other switching elements or gate circuits may be used, or any combination of elements may be used, to implement power supply switch 104. In one embodiment, a direct power supply may be used rather than voltage regulator 102. Also, in an alternate embodiment, different voltage regulators may be used to provide VDDC 130 and VDD 132.

In the illustrated embodiment, system 100 includes both running domain functional circuitry 128 and gated power domain circuitry 126. Gated power domain circuitry 126 includes circuitry whose clocks may be removed during low power modes such as when system 100 is in a deep sleep mode or is in an idle mode. During those times when the clocks are off, power may also be removed from portions of the circuitry to help reduce leakage current. For example, in the illustrated embodiment, gated power domain circuitry 126 receives both VDDC 130 and VDD 132, wherein, during normal or full power operation, VDD control 110 is set to a logic level 0 by low power controller 118 in order to couple VDD 132 to VDDC 130. Note that normal or full power operation may also be referred to as functional mode, normal operating mode, or a non-low power mode. Therefore, during normal or full power operation, both VDDC 130 and VDD 132 provide power to gated power domain circuitry 126. However, during a low power mode, VDD control 110 may be set to a logic level one in order to decouple VDD 132 from VDDC 130, thus gating off VDD 132. In this case, only portions of gated power domain circuitry 126 (those portions which, for example, retain state information) are powered by VDDC 130 while the remaining portions which are coupled to VDD 132 are powered down. As was described above, gated power domain functional circuitry 124 within gated power domain circuitry 126 may include state retention registers, isolation logic, embedded memories, etc.

Running domain functional circuitry 128 includes circuitry which may not be placed in a deep sleep mode and therefore continuously receives power (VDDC 130). This circuitry may include, for example, a real time clock that needs to constantly remain powered, or other circuitry such as a deep sleep module (which can periodically wake up system 100 to check for activity, such as, for example, calls or messages), an interrupt buffer (which detects activity, such as, for example, key presses), and other blocks which monitor system 100 or provide critical functions which should not be turned off. This circuitry may therefore include non state-retentive devices, such as non state-retentive flip-flops and buffers (which may operate as normal flip-flops and buffers as known in the art today). Since running domain functional circuitry 128 is continuously operating, it remains continuously powered, and thus receives only VDDC 130 since its power will not be gated, unlike those portions of gated power domain circuitry 126 which receive VDD 132. (Note that clocks are not illustrated in FIG. 1, but may be implemented in a variety of ways, as known in the art.)

Although FIG. 1 has been illustrated as having two distinct functional circuitry blocks (blocks 124 and 128), it should be understood that system 100 may include any number of gated power domain circuitry regions and running domain circuitry regions. For example, in one embodiment, gated power domain circuitry and running domain circuitry are not physically separate blocks, but instead are integrated with each other, receiving VDDC 130 and VDD 132, as needed. Also note that the circuitry within gated power domain functional circuitry 124 and running domain functional circuitry 128 may include any type of circuitry to perform any type of function, as needed by system 100. Also, in alternate embodiments, system 100 may include any number and type of power domain circuitries (in addition to the gated power domain and running domain functional circuitries). In one embodiment, a plurality of different power mode control signals is generated within system 100, where any of the these power mode control signals may be buffered by a fanout network such as fanout network 122. Therefore, system 100 may be designed in a variety of different ways for a variety of different applications. The functional circuitry of system 100 will therefore not be discussed in more detail herein.

Low power controller 118 may be used to generate a power mode control signal, such as PDN 120, to enter a low power mode, such as a deep sleep mode or idle mode. For example, in the illustrated embodiment, low power controller 118 receives a low power request 114. This request can be a signal generated from a power management module (not shown) or any other circuitry within data processing system 100 which indicates to low power controller 118 when a low power mode is needed. Low power request 114 can also correspond to a value stored in memory (such as, for example, a bit) that is controllable by software running on data processing system 100. Alternatively, low power request 114 may be received from a source external to data processing system 100. In response to receiving low power request 114, low power controller 118 indicates to gated power domain circuitry 126, by asserting PDN 120, that a low power mode is to be entered (i.e. that power gating is to be performed). Therefore, in one embodiment, low power controller 118 sets PDN 120 to a logic level 0 such that portions of gated power domain functional circuitry 124 may be powered down and may also set VDD control 110 to a logic level one to decouple VDD 132 from VDDC 130. Note that in the illustrated embodiments of FIGS. 1, 2, and 4, PDN 120 is an active low signal and VDD control 110 is an active high signal. However, in the illustrated embodiment of FIG. 3, the power mode control signal, PD 320, is an active high signal.

Figure 2:
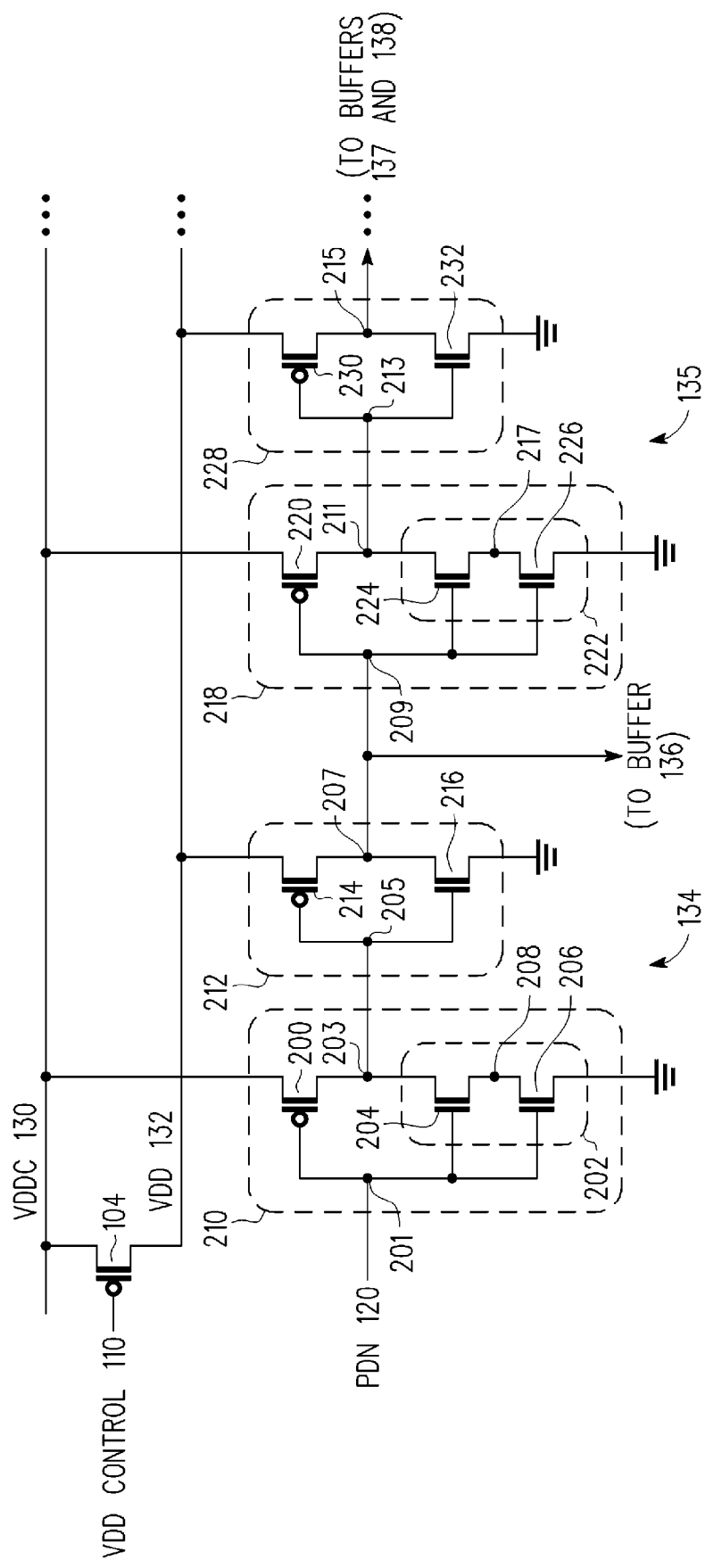
FIG. 2 illustrates, in schematic form, two non-inverting buffers of FIG. 1, in accordance with one embodiment of the present invention.

FIG. 2 illustrates a portion of system 100, including schematics of non-inverting buffers 134 and 135, in accordance with one embodiment of the present invention. Non-inverting buffer 134 includes an inverting gate 210 coupled to an inverting gate 212. An input 201 (i.e. node 201) of inverting gate 210 receives PDN 120, and an output 203 (i.e. node 203) of inverting gate 210 is connected to an input 205 (i.e. node 205) of inverting gate 212. Output 207 (i.e. node 207) of inverting gate 212 provides the output of buffer 134. In the illustrated embodiment, non-inverting buffer 134 includes only two inverting gates, where input 201 of inverting gate 210 is directly connected to an input of buffer 134 itself via a conductor. That is, no other inverting gates are present between the input of buffer 134 and inverting gate 210. Also, no other inverting gates are present between the output of inverting gate 212 and the output of buffer 134. Inverting gate 210 includes a P-channel transistor 200, an N-channel transistor 204, and an N-channel transistor 206. A first current electrode of P-channel transistor 200 is connected to the VDDC voltage terminal to receive VDDC 130, a second current electrode of P-channel transistor 200 is connected to node 203, and a control electrode of P-channel transistor is connected to node 201. A first current electrode of N-channel transistor 204 is connected to node 203, a second current electrode of N-channel transistor 204 is connected to node 208, and a control electrode of N-channel transistor 204 is connected to node 201. A first current electrode of N-channel transistor 206 is connected to node 208, a second current electrode of N-channel transistor 206 is connected to ground (also referred to as VSS or a VSS terminal), and a control electrode of transistor 206 is connected to node 201. Inverting gate 212 includes a P-channel transistor 214 and an N-channel transistor 216. A first current electrode of P-channel transistor 214 is connected to the VDD voltage terminal to receive VDD 132, a second current electrode of P-channel transistor 214 is connected to node 207, and a control electrode of P-channel transistor 214 is connected to node 205. A first current electrode of N-channel transistor 216 is connected to node 207, a second current electrode of N-channel transistor 216 is connected to ground, and a control electrode of N-channel transistor 216 is connected to node 205.

Non-inverting buffer 135 includes an inverting gate 218 coupled to an inverting gate 228. An input 209 (i.e. node 209) of inverting gate 218 is connected to the output of buffer 134 (e.g. node 207), and an output 211 (i.e. node 211) of inverting gate 218 is connected to an input 213 (i.e. node 213) of inverting gate 228. Output 215 (i.e. node 215) of inverting gate 228 provides the output of buffer 135. In the illustrated embodiment, non-inverting buffer 135 includes only two inverting gates, where input 209 of inverting gate 218 is directly connected to an input of buffer 135 itself via a conductor. That is, no other inverting gates are present between the input of buffer 135 and inverting gate 218. Also, no other inverting gates are between the output of inverting gate 228 and the output of buffer 135. Inverting gate 218 includes a P-channel transistor 220, an N-channel transistor 224, and an N-channel transistor 226. A first current electrode of P-channel transistor 220 is connected to the VDDC voltage terminal to receive VDDC 130, a second current electrode of P-channel transistor 220 is connected to node 211, and a control electrode of P-channel transistor is connected to node 209. A first current electrode of N-channel transistor 224 is connected to node 211, a second current electrode of N-channel transistor 224 is connected to node 217, and a control electrode of N-channel transistor 224 is connected to node 209. A first current electrode of N-channel transistor 226 is connected to node 217, a second current electrode of N-channel transistor 226 is connected to ground (also referred to as VSS or a VSS terminal), and a control electrode of transistor 226 is connected to node 209. Inverting gate 228 includes a P-channel transistor 230 and an N-channel transistor 232. A first current electrode of P-channel transistor 230 is connected to the VDD voltage terminal to receive VDD 132, a second current electrode of P-channel transistor 230 is connected to node 215, and a control electrode of P-channel transistor 230 is connected to node 213. A first current electrode of N-channel transistor 232 is connected to node 215, a second current electrode of N-channel transistor 232 is connected to ground, and a control electrode of N-channel transistor 232 is connected to node 213.

Note that output node 207 of buffer 134 fans out to a plurality of input nodes of other buffers (to the input of buffer 135 and to the input of buffer 136, as illustrated in FIG. 1). In the illustrated embodiment of FIG. 2, each of inverting gates 210 and 218 are implemented as inverters having stacked N-channel transistors 202 and 222, respectively, where stacked N-channel transistors 202 includes N-channel transistors 204 and 206 connected in series via node 208, and stacked N-channel transistors 222 includes N-channel transistors 224 and 226 connected in series via node 217. In alternate embodiments, single N-channel transistors may be used in place of stacked transistors. Also, in one embodiment, each transistor corresponds to a metal-oxide semiconductor field effect transistor (MOSFET). However, alternatively, other types of transistors or switching devices may be used. Also, as known to those skilled in the art, each transistor described herein may be implemented as multi-finger devices where each transistor may include one or more transistor fingers.

Note that, in one embodiment, inverting gates 210 and 218 may be referred to as first inverting gates of the corresponding buffers 134 and 135, respectively, and inverting gates 212 and 228 may be referred to as second inverting gates of the corresponding buffers 134 and 135, respectively. Alternatively, inverting gates 212 and 228 may be referred to as first inverting gates of the corresponding buffers 134 and 135, respectively, and inverting gates 210 and 218 may be referred to as second inverting gates of the corresponding buffers 134 and 135, respectively. Also, note that, in the illustrated embodiment, each of inverting gates 210, 212, 218, and 228 are implemented as inverters. However, alternatively, any one or more of the inverting gates within any of non-inverting buffers 134-147 may include one or more different types of inverting gates, such as, for example, NAND gates, NOR gates, etc. Furthermore, in alternate embodiments, one or more of non-inverting buffers 134-147 may include any even number of inverting devices.

In one embodiment, a total width of transistors 214 and 216 is greater than a total width of transistors 200, 204, and 206. In one embodiment, the total width of transistors 214 and 216 is at least 4 times greater than the total width of transistors 200, 204, and 206. For example, in one embodiment, the width of P-channel transistor 214 is greater than the width of P-channel transistor 200 (e.g. greater than 4 times the width), and the width of N-channel transistor 216 is great than the width of each of N-channel transistors 204 and 206 (e.g. greater than 4 times the width). In the case of using a single N-channel transistor rather than stacked transistors 202, the width of N-channel transistor 216 would be greater (e.g. at least 4 times greater) than the width of this signal N-channel transistor.

In operation, note that during a non-lower power mode (i.e. during functional mode), PDN 120 gets propagated via fanout network 122 (e.g. via buffers 134 and 135) to the appropriate PDN inputs of elements within gated power domain functional circuitry 124, in which everything is fully powered. That is, during this non-low power mode, VDD 132 is coupled to VDDC 130 and is therefore approximately equal in voltage to VDDC 130. Alternatively, a second voltage regulator can set VDD 132 to a voltage approximately equal to that of VDDC 130. Therefore, buffers 134 and 135 operate as known in the art when fully powered. However, during a low power mode, when VDD 132 is decoupled from VDDC 130, the voltage of VDD 132 is reduced to 0 or to a low voltage near zero. In this case, since PDN 120 is active low, it is set to a logic level 0 for low power mode. Therefore, a logic level 0 appears at node 201, a logic level 1 appears at nodes 203 and 205, and a logic level 0 appears at node 207. That is, the value of "0" for PDN 120 is propagated through non-inverting buffer 134 which outputs a value of "0" at node 207. Note that when node 205 is a logic level "1", transistor 216 is "on" and draws current down from node 207 to bring its value down to a logic level "0". Note that in this situation, when the input to inverting gate 212 at node 205 is high (i.e. a logic level "1"), it is N-channel transistor 216 which assumes the primary role in pulling current from node 207. Therefore, even though the first current electrode of P-channel transistor 214 is no longer receiving a voltage of approximately VDDC (since the voltage terminal has been decoupled from the continuous voltage supply), the output of buffer 134 is still able to provide a valid, non-inverted, value of PDN 120.

In one embodiment, by partially removing power from fanout network 122 (by decoupling VDD 132 from VDDC 130), leakage current can be greatly reduced, while still allowing fanout network 122 to adequately propagate a valid power mode control signal (PDN 120) during a low power mode. By reducing or removing power from the second and larger inverting gate (inverting gate 212), more leakage current can be reduced than if power were removed from the first and smaller inverting gate (inverting gate 210). Also, by designing the power mode control signal (e.g. PDN 120) as an active low signal, the transition from high to low performed by inverting gate 212 can still be managed by relatively large N-channel transistor 216 even though the first current electrode of P-channel transistor 214 is no longer at or near the voltage value of VDDC. In one embodiment, inverting gates 210 and 212 are closely spaced to minimize capacitance that inverting gate 210 must drive. This allows small transistor widths to be used for inverting gate 210, thereby reducing leakage current from VDDC 130. The use of stacked transistors 202 may further reduce leakage by allowing the voltage at node 208 to rise above the voltage at the control electrode of transistor 204 when PDN 120 is low.

Note that the same descriptions provided above with respect to buffer 134 apply to buffer 135, and to buffers 136-147 as well. Each of buffers 134-147 may be the same type of buffer, or may be different from each other.

Figure 4:
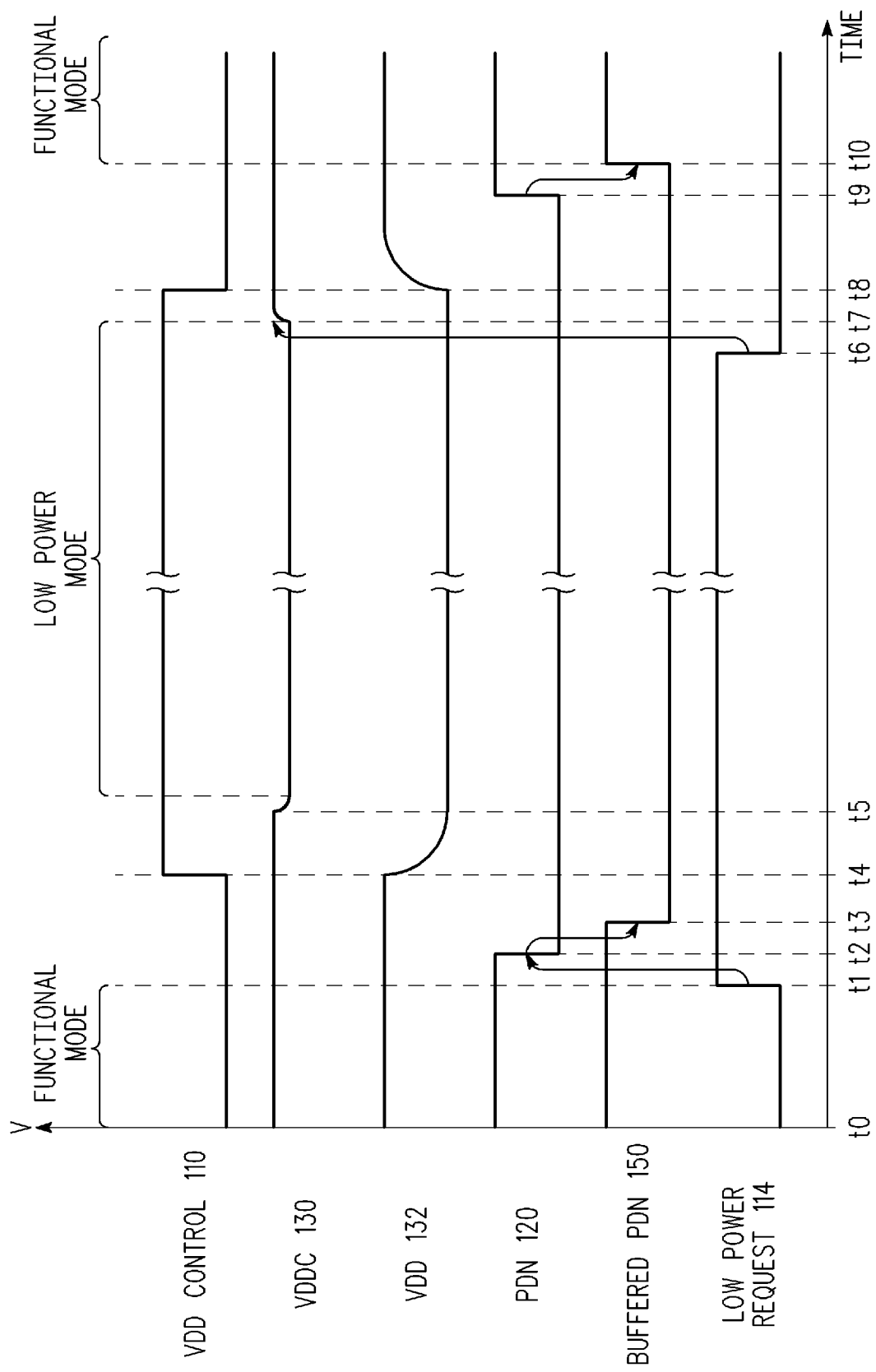
FIG. 4 illustrates a timing diagram illustrating operation of a portion of the system of FIG. 1, in accordance with one embodiment of the present invention.

FIG. 4 illustrates a timing diagram of various signals within system 100. At time t1, low power request 114 is asserted to indicate the desire to enter a low power mode. Low power controller 118, in response to the assertion of low power request 114, asserts PDN 120 at time t2. Since PDN 120 is an active low signal, PDN 120, at time t2, transitions from high to low. Buffered PDN 150 (one of the outputs of fanout network 122), at some time later, t3, is also asserted. Therefore, the time between t2 and t3 may represent the time it takes for the assertion of PDN 120 to propagate through fanout network 122. Low power controller 118, at some time later, t4, asserts VDD control 110. Since VDD control 110 is an active high signal, VDD control 110 transitions, at time t4, from low to high. Once VDD control 110 is asserted, VDD 132 is decoupled from VDDC 130, and the voltage level of VDD 132 begins to fall. In one embodiment, low power controller 118 asserts VDD control 110 a sufficient amount of time after assertion of low power request signal 114 to ensure that the buffered PDN signals makes it to all the circuit elements, such as flip flops 154 and 156, before decoupling VDD 132 from VDDC 130. In one embodiment, at time t5, voltage regulator 102 reduces VDDC 130 in order to save more power during low power mode. In one embodiment, low power controller 118 communicates to voltage regulator 102 (via, e.g., signals 112) when, in response to assertion of low power request 114, VDDC 130 can be reduced. Alternatively, VDDC 130 may not be reduced during low power mode.

At some time later, during operation in low power mode, low power request 114 is deasserted, to indicate the desire to exit low power mode. Therefore, at time t6, low power request 114 transitions back from low to high. In response to the deassertion of low power request 114, low power controller 118 indicates to voltage regulator 102 that low power mode is to be exited so that voltage regulator 102 may restore VDDC 130 to full power (assuming VDDC 130 was lowered during low power mode). Once VDDC 130 is restored, if necessary, low power controller 118, at time t8, deasserts VDD control 110. Upon deassertion of VDD control 110, VDD 132 is again coupled to VDDC 130 such that it begins to rise again to a level approximately equal to VDDC 130. Low power controller 118 waits a sufficient amount of time to ensure that VDD 132 has also been restored to a level approximately equal to VDDC 130 and then deasserts PDN 120. Therefore, at time t9, which occurs after t8 and after VDD 132 is restored, PDN 120 transitions back from low to high. Therefore, at some time later, t10, the buffered PDN signals such as buffered PDN 150 are also deasserted. Again, the time from t9 to t10 may represent the amount of time required for the deassertion of PDN 120 to propagate through fanout network 122. Therefore, note that the time period before t1 (prior to assertion of low power request 114) and the time period after t10 (after deassertion of the buffered PDN signals) corresponds to functional mode in which system 100 is in normal operation at full power (i.e. in a non-low power mode). The time period after the reducing of VDDC 130 until time t7 (when VDDC 130 begins to be restored) corresponds to low power mode. In the case in which VDDC 130 is not reduced during low power mode, low power mode occurs from about time t5 (once VDD 132 drops) to time t7. Therefore, note that the assertion of PDN 120 (and buffered PDN signals) envelopes VDD control 110 to ensure that the PDN inputs within gated power domain functional circuitry 124 receive and react to the assertion and deassertion of the buffered PDN signals prior to reducing (decoupling) or restoring (coupling) VDD 132.

Figure 3:
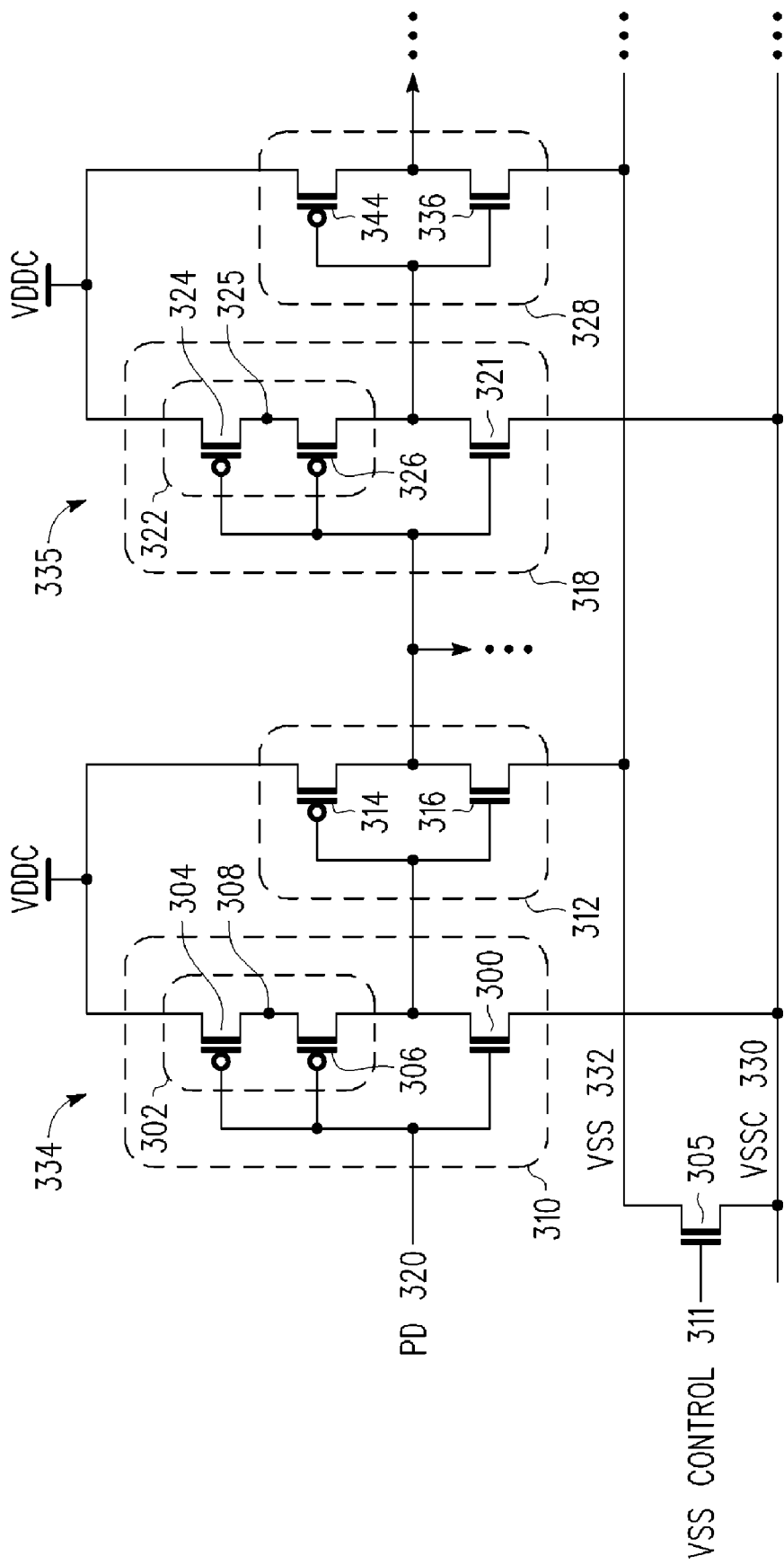
FIG. 3 illustrates, in schematic form, two non-inverting buffers in accordance with another embodiment of the present invention.

FIG. 3 illustrates an alternate embodiment in which the power mode control signal which controls entry into low power mode is an active high signal, referred to as PD 320. FIG. 3 illustrates a portion of a system analogous to system 100 in which a continuous VSS supply (VSSC 330) and a gated VSS supply (VSS 332) are used rather than using a continuous and gated VDD. Therefore, note that a power supply switch can be used to couple and decouple VSSC 330 and VSS 332. In the illustrated embodiment of FIG. 3, an N-channel transistor 305 is used to implement the power supply switch whose gate electrode is coupled to receive a power switch control signal, VSS control 311, which operates analogously to VDD control 110, except that it is an active low signal. Therefore, note that PD 320 and VSS control 311 can be generated by a low power controller in a similar manner as PDN 120 and VDD control 110 are generated by low power controller 118. Since the embodiment of FIG. 3 can operate in a system analogous to system 100, many of the details provided above with respect to system 100 also apply to the embodiment of FIG. 3.

FIG. 3 illustrates a portion of a fanout network similar in arrangement to fanout network 122, analogous to the portion illustrated in FIG. 2, which illustrates two non-inverting buffers 334 and 335 coupled in series. An input of buffer 334 receives PD 320, and an output of buffer 334 is connected to an input of buffer 335. The outputs of each of buffers 334 and 335 may fan out and be connected to inputs of other buffers within a fanout network. Each of buffers 334 and 335 include two series connected inverting gates.

Non-inverting buffer 334 includes an inverting gate 310 coupled to an inverting gate 312. An input of inverting gate 310 receives PD 320, and an output of inverting gate 310 is connected to an input of inverting gate 312. The output of inverting gate 312 provides the output of buffer 334. In the illustrated embodiment, non-inverting buffer 334 includes only two inverting gates, where the input of inverting gate 310 is directly connected to an input of buffer 334 itself via a conductor. That is, no other inverting gates are present between the input of buffer 334 and inverting gate 310. Also, no other inverting gates are present between the output of inverting gate 312 and the output of buffer 334. Inverting gate 310 includes a P-channel transistor 304, a P-channel transistor 306, and an N-channel transistor 300. A first current electrode of P-channel transistor 304 is connected to the VDDC voltage terminal to receive VDDC, a second current electrode of P-channel transistor 304 is connected to node 308, and a control electrode of P-channel transistor 304 is connected to the input of buffer 334 to receive PD 320. A first current electrode of P-channel transistor 306 is connected to node 308, a second current electrode of P-channel transistor 306 is connected to an output of inverting gate 310, and a control electrode of transistor 306 is connected to the input of buffer 334. A first current electrode of N-channel transistor 300 is connected to the second current electrode of P-channel transistor 306, a second current electrode of N-channel transistor 300 is connected to the VSSC voltage terminal to receive VSSC 330, and a control electrode of N-channel transistor 300 is connected the input of buffer 334. Inverting gate 312 includes a P-channel transistor 314 and an N-channel transistor 316. A first current electrode of P-channel transistor 314 is connected to the VDDC voltage terminal to receive VDDC, a second current electrode of P-channel transistor 314 is connected to the output of inverting gate 312, and a control electrode of P-channel transistor 314 is connected to the input of inverting gate 312. A first current electrode of N-channel transistor 316 is connected to the second current electrode of P-channel transistor 314, a second current electrode of N-channel transistor 316 is connected to the VSS terminal to receive VSS 332, and a control electrode of N-channel transistor 316 is connected to the input of inverting gate 312.

Non-inverting buffer 335 includes an inverting gate 318 coupled to an inverting gate 328. An input of inverting gate 318 is connected to the output of buffer 334, and an output of inverting gate 318 is connected to an input of inverting gate 328. The output of inverting gate 328 provides the output of buffer 335. In the illustrated embodiment, non-inverting buffer 335 includes only two inverting gates, where the input of inverting gate 318 is directly connected to an input of buffer 335 itself via a conductor. That is, no other inverting gates are present between the input of buffer 335 and inverting gate 318. Also, no other inverting gates are present between the output of inverting gate 328 and the output of buffer 335. Inverting gate 318 includes a P-channel transistor 324, a P-channel transistor 326, and an N-channel transistor 321. A first current electrode of P-channel transistor 324 is connected to the VDDC voltage terminal to receive VDDC, a second current electrode of P-channel transistor 324 is connected to node 325, and a control electrode of P-channel transistor 324 is connected to the input of buffer 335 (which is connected to the output of buffer 334). A first current electrode of P-channel transistor 326 is connected to node 325, a second current electrode of P-channel transistor 326 is connected to an output of inverting gate 318, and a control electrode of transistor 326 is connected to the input of buffer 335. A first current electrode of N-channel transistor 321 is connected to the second current electrode of P-channel transistor 326, a second current electrode of N-channel transistor 321 is connected to the VSSC voltage terminal to receive VSSC 330, and a control electrode of N-channel transistor 321 is connected the input of buffer 335. Inverting gate 328 includes a P-channel transistor 344 and an N-channel transistor 336. A first current electrode of P-channel transistor 344 is connected to the VDDC voltage terminal to receive VDDC, a second current electrode of P-channel transistor 344 is connected to the output of inverting gate 328, and a control electrode of P-channel transistor 344 is connected to the input of inverting gate 328. A first current electrode of N-channel transistor 336 is connected to the second current electrode of P-channel transistor 344, a second current electrode of N-channel transistor 336 is connected to the VSS terminal to receive VSS 332, and a control electrode of N-channel transistor 336 is connected to the input of inverting gate 328.

In the illustrated embodiment of FIG. 3, each of inverting gates 310 and 318 are implemented as inverters having stacked P-channel transistors 302 and 322, respectively, where stacked P-channel transistors 302 includes P-channel transistors 304 and 306 connected in series via node 308, and stacked P-channel transistors 322 includes P-channel transistors 324 and 326 connected in series. In alternate embodiments, single P-channel transistors may be used in place of stacked transistors. Also, in one embodiment, each transistor corresponds to a metal-oxide semiconductor field effect transistor (MOSFET). However, alternatively, other types of transistors or switching devices may be used. Also, as known to those skilled in the art, each transistor described herein may be implemented as multi-finger devices where each transistor may include one or more transistor fingers.

Also, note that, in the illustrated embodiment, each of inverting gates 310, 312, 318, and 328 are implemented as inverters. However, alternatively, any one or more of the inverting gates within any of the non-inverting buffers within a fanout network including buffers 334 and 335 may include one or more different types of inverting gates, such as, for example, NAND gates, NOR gates, etc. Furthermore, in alternate embodiments, one or more of the non-inverting buffers may include any even number of inverting devices.

In one embodiment, a total width of transistors 314 and 316 is greater than a total width of transistors 300, 304, and 306. In one embodiment, the total width of transistors 314 and 316 is at least 4 times greater than the total width of transistors 300, 304, and 306. For example, in one embodiment, the width of P-channel transistor 314 is greater than the width (e.g. greater than 4 times the width) of each of P-channel transistors 304 and 306, and the width of N-channel transistor 316 is great than the width of N-channel transistor 300 (e.g. greater than 4 times the width). In the case of using a single P-channel transistor rather than stacked transistors 302, the width of P-channel transistor 314 would be greater (e.g. at least 4 times greater) than the width of this single P-channel transistor.

In operation, note that during a non-lower power mode (i.e. during functional mode), PD 320 gets propagated via a fanout network (e.g. via buffers 334 and 335) to appropriate PD inputs of elements within gated power domain functional circuitry, in which everything is fully powered. That is, during this non-low power mode, VSS 332 is coupled to VSSC 330 and is therefore approximately equal in voltage to VSSC 330. Alternatively, a second voltage regulator can set VSS 332 to a voltage approximately equal to that of VSSC 330. Therefore, buffers 334 and 335 operate as known in the art when in functional mode. However, during a low power mode, VSS 332 is decoupled from VSSC 330, thus "breaking" the current loop and removing power from those elements coupled to VSS 332. In this case, since PD 320 is active high, it is set to a logic level 1 for low power mode. Therefore, a logic level 1 appears at the input of inverting gate 310, a logic level 0 appears at the output of inverting gate 310, and a logic level 1 appears at the output of inverting gate 312. That is, the value of "1" for PD 320 is propagated through non-inverting buffer 334 which outputs a value of "1". When the output of inverting gate 310 is a logic level "0", transistor 314 is "on" and draws current down from VDDC to bring the output of inverting gate 312 up to a logic level "1". Note that in this situation, when the input to inverting gate 312 is low (i.e. a logic level "0"), it is P-channel transistor 314 which assumes the primary role in pulling current from VDDC. Therefore, even though the second current electrode of N-channel transistor 316 is no longer receiving a voltage of approximately VSSC (since the voltage terminal has been decoupled from the continuous voltage supply), the output of buffer 334 is still able to provide a valid, non-inverted, value of PD 320.

In one embodiment, by partially removing VSS from buffers 334 and 335 (by decoupling VSS 332 from VSSC 330), leakage current can be greatly reduced, while still allowing the propagation of a valid power mode control signal (PD 320) during a low power mode. By reducing or removing power from the second and larger inverting gate (inverting gate 312), more leakage current can be reduced than if power were removed from the first and smaller inverting gate (inverting gate 310). Also, by designing the power mode control signal (e.g. PD 320) as an active high signal, the transition from low to high performed by inverting gate 312 can still be managed by relatively large P-channel transistor 314 even though the second current electrode of N-channel transistor 316 is no longer at or near the voltage value of VSSC. In one embodiment, inverting gates 310 and 312 are closely spaced to minimize capacitance that inverting gate 310 must drive. This allows small transistor widths to be used for inverting gate 310, thereby reducing leakage current from VDDC to VSSC 330. The use of stacked transistors 302 may further reduce leakage by allowing the voltage at node 308 to fall below the voltage at the control electrode of transistor 306 when PD 320 is high.

Note that the same descriptions provided above with respect to buffer 334 apply to buffer 335.

By now it should be appreciated that there has been provided a fanout network capable of propagating a valid power mode control signal to enable low power mode in various circuit elements. Furthermore, this power mode control signal remains valid (i.e. provides a valid logic value) during the low power mode during which power is partially decoupled from the fanout network. In the case of an active low power mode control signal, non-inverting buffers may be used having two series connected inverting gates in which, during low power mode, power is decoupled from the second inverting gate. In this manner, leakage current is reduced and power can be conserved, thus improving the ability to extend battery life.

Similarly, in the case of an active high power mode control signal, non-inverting buffers may be used having two series connected inverting gates in which, during low power mode, VSS is decoupled from the second inverting gate to reduce leakage current.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Although the invention has been described with respect to specific conductivity types or polarity of potentials, skilled artisans appreciated that conductivity types and polarities of potentials may be reversed.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Some of the above embodiments, as applicable, may be implemented using a variety of different information processing systems. For example, although FIG. 1 and the discussion thereof describe an exemplary information processing architecture, this exemplary architecture is presented merely to provide a useful reference in discussing various aspects of the invention. Of course, the description of the architecture has been simplified for purposes of discussion, and it is just one of many different types of appropriate architectures that may be used in accordance with the invention. Those skilled in the art will recognize that the boundaries between logic blocks are merely illustrative and that alternative embodiments may merge logic blocks or circuit elements or impose an alternate decomposition of functionality upon various logic blocks or circuit elements.

Thus, it is to be understood that the architectures depicted herein are merely exemplary, and that in fact many other architectures can be implemented which achieve the same functionality. In an abstract, but still definite sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected," or "operably coupled," to each other to achieve the desired functionality.

Also for example, in one embodiment, the illustrated elements of system 100 are circuitry located on a single integrated circuit or within a same device. Alternatively, system 100 may include any number of separate integrated circuits or separate devices interconnected with each other. Also for example, system 100 or portions thereof may be soft or code representations of physical circuitry or of logical representations convertible into physical circuitry. As such, system 100 may be embodied in a hardware description language of any appropriate type.

Furthermore, those skilled in the art will recognize that boundaries between the functionality of the above described operations are merely illustrative. The functionality of multiple operations may be combined into a single operation, and/or the functionality of a single operation may be distributed in additional operations. Moreover, alternative embodiments may include multiple instances of a particular operation, and the order of operations may be altered in various other embodiments.

In one embodiment, system 100 is a computer system such as a personal computer system. Other embodiments may include different types of computer systems. Computer systems are information handling systems which can be designed to give independent computing power to one or more users. Computer systems may be found in many forms including but not limited to mainframes, minicomputers, servers, workstations, personal computers, notepads, personal digital assistants, electronic games, automotive and other embedded systems, cell phones and various other wireless devices. A typical computer system includes at least one processing unit, associated memory and a number of input/output (I/O) devices.

A computer system processes information according to a program and produces resultant output information via I/O devices. A program is a list of instructions such as a particular application program and/or an operating system. A computer program is typically stored internally on computer readable storage medium or transmitted to the computer system via a computer readable transmission medium. A computer process typically includes an executing (running) program or portion of a program, current program values and state information, and the resources used by the operating system to manage the execution of the process. A parent process may spawn other, child processes to help perform the overall functionality of the parent process. Because the parent process specifically spawns the child processes to perform a portion of the overall functionality of the parent process, the functions performed by child processes (and grandchild processes, etc.) may sometimes be described as being performed by the parent process.

Although the invention is described herein with reference to specific embodiments, various modifications and changes can be made without departing from the scope of the present invention as set forth in the claims below. For example, rather than decoupling VDD from VDDC, the current loop may be broken by decoupling VSS from VSSC. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

Additional Text:

1. A circuit comprising:
    a circuit input for receiving a power mode control signal to indicate a low power mode of the circuit;
    a plurality of non-inverting buffers to provide buffering for the power mode control signal, a first of the non-inverting buffers coupled to the circuit input for receiving the power mode control signal and having an output connected to an input of each of two or more of the plurality of non-inverting buffers, each of the two or more of the plurality of non-inverting buffers having an output connected to an input of additional non-inverting buffers to form a fanout signal distribution network;
    each non-inverting buffer comprising an even number of serial-connected inverting gates, at least a portion of the plurality of non-inverting buffers providing respective outputs of the fanout signal distribution network, each output of the fanout signal distribution network having a valid logic state in the low power mode;
    a first voltage terminal for receiving a first voltage; and
    a second voltage terminal for receiving a second voltage, the second voltage having a voltage value different from the first voltage in the low power mode, wherein at least two of the non-inverting buffers each comprises a first inverting gate connected to the second voltage terminal and providing an output thereof and a second inverting gate connected to the first voltage terminal, an input of the first inverting gate is connected to an output of the second inverting gate.
2. The circuit of statement 1 wherein the input of the second inverting gate is connected directly to an input of the respective non-inverting buffer by a conductor.
3. The circuit of statement 1 wherein the second voltage is substantially equal to the first voltage in a functional mode of the circuit which is a non-low power mode of the circuit.
4. The circuit of statement 1 wherein the low power mode determines a logic value of the power mode control signal for the circuit.
5. The circuit of statement 1 wherein the first inverting gate further comprises:
    a first P-channel transistor having a first current electrode connected to the second voltage terminal, a control electrode and a second current electrode; and
    a first N-channel transistor having a first current electrode connected to the second current electrode of the first P-channel transistor, a control electrode connected to the control electrode of the first P-channel transistor, and a second current electrode connected to a third voltage terminal; and
    wherein the second inverting gate further comprises:
    a second P-channel transistor having a first current electrode connected to the first voltage terminal, a control electrode, and a second current electrode connected to the control electrode of each of the first P-channel transistor and the first N-channel transistor; and
    a second N-channel transistor having a first current electrode coupled to the second current electrode of the second P-channel transistor, a control electrode coupled to the control electrode of the second P-channel transistor for providing an input thereof, and a second current electrode coupled to the third voltage terminal.
6. The circuit of statement 5 wherein the second inverting gate further comprises:
    a third N-channel transistor having a first current electrode connected to the second current electrode of the second N-channel transistor, a control electrode connected to the control electrode of the second N-channel transistor, and a second current electrode coupled to the third voltage terminal.
7. The circuit of statement 1 further comprising:
    a voltage regulator for providing the first voltage; and
    a power supply switch coupled to the voltage regulator and having a control terminal for receiving a power switch control signal, the power supply switch selectively providing the second voltage in response to the power switch control signal.
8. The circuit of statement 7 wherein the power mode control signal is an active low logic signal at the circuit input.
9. The circuit of statement 7 wherein the power mode control signal is an active high logic signal at the circuit input.
10. The circuit of statement 1 wherein the first inverting gate further comprises:
    a first P-channel transistor having a first current electrode connected to a third voltage terminal, a control electrode and a second current electrode; and
    a first N-channel transistor having a first current electrode connected to the second current electrode of the first P-channel transistor, a control electrode connected to the control electrode of the first P-channel transistor, and a second current electrode connected to the second voltage terminal; and
    wherein the second inverting gate further comprises:
    a second P-channel transistor having a first current electrode coupled to the third voltage terminal, a control electrode, and a second current electrode; and
    a second N-channel transistor having a first current electrode coupled to the second current electrode of the second P-channel transistor, a control electrode coupled to the control electrode of the second P-channel transistor for providing an input thereof, and a second current electrode coupled to the first voltage terminal.
11. The circuit of statement 10 wherein the second inverting gate further comprises:
    a third P-channel transistor having a first current electrode connected to the first current electrode of the second P-channel transistor, a control electrode connected to the control electrode of the second P-channel transistor, and a second current electrode coupled to the third voltage terminal.
12. The circuit of statement 1 wherein the first inverting gate and the second inverting gate are each implemented with transistors having predetermined transistor channel widths and wherein a total transistor width in the first inverting gate is more than a total transistor width in the second inverting gate.
13. A method of buffering a power mode control signal comprising:
    receiving the power mode control signal at an input of a circuit to indicate a low power mode of the circuit;
    buffering the power mode control signal with a plurality of non-inverting buffers, a first of the non-inverting buffers coupled to the input of the circuit for receiving the power mode control signal and having an output connected to an input of each of two or more of the plurality of non-inverting buffers, each of the two or more of the plurality of non-inverting buffers having an output connected to an input of additional non-inverting buffers to form a fanout signal distribution network having valid outputs in the low power mode;
    receiving a first voltage at a first voltage terminal;
    receiving a second voltage at a second voltage terminal; and changing the second voltage to a voltage value that differs from the first voltage in the low power mode, wherein at least two of the non-inverting buffers each comprises a first inverting gate connected to the second voltage terminal and providing an output thereof and a second inverting gate connected to the first voltage terminal, an input of the first inverting gate being connected to an output of the second inverting gate.

14. The method of statement 13 further comprising:
providing the second voltage substantially equal to the first voltage in a functional mode of the circuit which is a non-low power mode of the circuit.

15. The method of statement 13 further comprising:
implementing the power mode control signal as an active low logic signal at the input of the circuit and lowering the second voltage to a voltage value below the first voltage in the low power mode.

16. The method of statement 13 further comprising:
implementing the power mode control signal as an active high logic signal at the input of the circuit and raising the second voltage to a voltage value above the first voltage in the low power mode.

17. A circuit, comprising:
a plurality of non-inverting buffers for receiving a power mode control signal to indicate a low power mode of the circuit, the plurality of non-inverting buffers forming a fanout signal distribution network by successive coupling wherein at least two of the plurality of non-inverting buffers are coupled to an output of at least one of the plurality of non-inverting buffers;
a plurality of functional storage circuits, each having a power-down input coupled to a predetermined one of the plurality of non-inverting buffers, each of the plurality of non-inverting buffers comprising:
 a first inverting gate having an input and an output and comprising a first transistor of a first conductivity type connected to a first voltage rail and a second transistor of a second conductivity type connected in series with the first transistor and connected to a second voltage rail; and
 a second inverting gate having an input connected to the output of the first inverting gate and having an output, the second inverting gate comprising a third transistor of the first conductivity type connected to a third voltage rail and a fourth transistor of the second conductivity type connected in series with the third transistor and connected to the second voltage rail, the second inverting gate providing a valid logic state when the circuit is in the low power mode.

18. The circuit of statement 17 wherein the first voltage rail is a continuous power supply voltage rail, the second voltage rail is a reference voltage rail, and the third voltage rail is for receiving a less positive voltage than the first voltage rail receives during the low power mode.

19. The circuit of statement 17 wherein the first voltage rail is a continuous power supply voltage rail, the second voltage rail is a continuous reference voltage rail, and the third voltage rail is for receiving a more positive voltage than the first voltage rail receives during the low power mode.

20. The circuit of statement 17 wherein the first inverting gate and the second inverting gate are each implemented with transistors having predetermined transistor channel widths and wherein a total transistor width in the second inverting gate is more than a total transistor width in the first inverting gate.

What is claimed is:

1. A circuit comprising:
a circuit input for receiving a power mode control signal to indicate a low power mode of the circuit;
a plurality of non-inverting buffers to provide buffering for the power mode control signal, a first of the non-inverting buffers coupled to the circuit input for receiving the power mode control signal and having an output connected to an input of each of two or more of the plurality of non-inverting buffers, each of the two or more of the plurality of non-inverting buffers having an output connected to an input of additional non-inverting buffers to form a fanout signal distribution network;
each non-inverting buffer comprising an even number of serial-connected inverting gates, at least a portion of the plurality of non-inverting buffers providing respective outputs of the fanout signal distribution network, each output of the fanout signal distribution network having a valid logic state in the low power mode;
a first voltage terminal for receiving a first voltage; and
a second voltage terminal for receiving a second voltage, the second voltage having a voltage value different from the first voltage in the low power mode, wherein at least two of the non-inverting buffers each comprises a first inverting gate connected to the second voltage terminal and providing an output thereof and a second inverting gate connected to the first voltage terminal, an input of the first inverting gate is connected to an output of the second inverting gate.

2. The circuit of claim 1 wherein the input of the second inverting gate is connected directly to an input of the respective non-inverting buffer by a conductor.

3. The circuit of claim 1 wherein the second voltage is substantially equal to the first voltage in a functional mode of the circuit which is a non-low power mode of the circuit.

4. The circuit of claim 1 wherein the low power mode determines a logic value of the power mode control signal for the circuit.

5. The circuit of claim 1 wherein the first inverting gate further comprises:
a first P-channel transistor having a first current electrode connected to the second voltage terminal, a control electrode and a second current electrode; and
a first N-channel transistor having a first current electrode connected to the second current electrode of the first P-channel transistor, a control electrode connected to the control electrode of the first P-channel transistor, and a second current electrode connected to a third voltage terminal; and
wherein the second inverting gate further comprises:
a second P-channel transistor having a first current electrode connected to the first voltage terminal, a control electrode, and a second current electrode connected to the control electrode of each of the first P-channel transistor and the first N-channel transistor; and
a second N-channel transistor having a first current electrode coupled to the second current electrode of the second P-channel transistor, a control electrode coupled to the control electrode of the second P-channel transistor for providing an input thereof, and a second current electrode coupled to the third voltage terminal.

6. The circuit of claim 5 wherein the second inverting gate further comprises:
a third N-channel transistor having a first current electrode connected to the second current electrode of the second N-channel transistor, a control electrode connected to the control electrode of the second N-channel transistor, and a second current electrode coupled to the third voltage terminal.

7. The circuit of claim 1 further comprising:
a voltage regulator for providing the first voltage; and
a power supply switch coupled to the voltage regulator and having a control terminal for receiving a power switch control signal, the power supply switch selectively providing the second voltage in response to the power switch control signal.

8. The circuit of claim 7 wherein the power mode control signal is an active low logic signal at the circuit input.

9. The circuit of claim 7 wherein the power mode control signal is an active high logic signal at the circuit input.

10. The circuit of claim 1 wherein the first inverting gate further comprises:
a first P-channel transistor having a first current electrode connected to a third voltage terminal, a control electrode and a second current electrode; and
a first N-channel transistor having a first current electrode connected to the second current electrode of the first P-channel transistor, a control electrode connected to the control electrode of the first P-channel transistor, and a second current electrode connected to the second voltage terminal; and
wherein the second inverting gate further comprises:
a second P-channel transistor having a first current electrode coupled to the third voltage terminal, a control electrode, and a second current electrode; and
a second N-channel transistor having a first current electrode coupled to the second current electrode of the second P-channel transistor, a control electrode coupled to the control electrode of the second P-channel transistor for providing an input thereof, and a second current electrode coupled to the first voltage terminal.

11. The circuit of claim 10 wherein the second inverting gate further comprises:
a third P-channel transistor having a first current electrode connected to the first current electrode of the second P-channel transistor, a control electrode connected to the control electrode of the second P-channel transistor, and a second current electrode coupled to the third voltage terminal.

12. The circuit of claim 1 wherein the first inverting gate and the second inverting gate are each implemented with transistors having predetermined transistor channel widths and wherein a total transistor width in the first inverting gate is more than a total transistor width in the second inverting gate.

13. A method of buffering a power mode control signal comprising:
receiving the power mode control signal at an input of a circuit to indicate a low power mode of the circuit;
buffering the power mode control signal with a plurality of non-inverting buffers, a first of the non-inverting buffers coupled to the input of the circuit for receiving the power mode control signal and having an output connected to an input of each of two or more of the plurality of non-inverting buffers, each of the two or more of the plurality of non-inverting buffers having an output connected to an input of additional non-inverting buffers to form a fanout signal distribution network having valid outputs in the low power mode;
receiving a first voltage at a first voltage terminal;
receiving a second voltage at a second voltage terminal; and
changing the second voltage to a voltage value that differs from the first voltage in the low power mode, wherein at least two of the non-inverting buffers each comprises a first inverting gate connected to the second voltage terminal and providing an output thereof and a second inverting gate connected to the first voltage terminal, an input of the first inverting gate being connected to an output of the second inverting gate.

14. The method of claim 13 further comprising:
providing the second voltage substantially equal to the first voltage in a functional mode of the circuit which is a non-low power mode of the circuit.

15. The method of claim 13 further comprising:
implementing the power mode control signal as an active low logic signal at the input of the circuit and lowering the second voltage to a voltage value below the first voltage in the low power mode.

16. The method of claim 13 further comprising:
implementing the power mode control signal as an active high logic signal at the input of the circuit and raising the second voltage to a voltage value above the first voltage in the low power mode.

17. A circuit, comprising:
a plurality of non-inverting buffers for receiving a power mode control signal to indicate a low power mode of the circuit, the plurality of non-inverting buffers forming a fanout signal distribution network by successive coupling wherein at least two of the plurality of non-inverting buffers are coupled to an output of at least one of the plurality of non-inverting buffers;
a plurality of functional storage circuits, each having a power-down input coupled to a predetermined one of the plurality of non-inverting buffers, each of the plurality of non-inverting buffers comprising:
a first inverting gate having an input and an output and comprising a first transistor of a first conductivity type connected to a first voltage rail and a second transistor of a second conductivity type connected in series with the first transistor and connected to a second voltage rail; and
a second inverting gate having an input connected to the output of the first inverting gate and having an output, the second inverting gate comprising a third transistor of the first conductivity type connected to a third voltage rail and a fourth transistor of the second conductivity type connected in series with the third transistor and connected to the second voltage rail, the second inverting gate providing a valid logic state when the circuit is in the low power mode.

18. The circuit of claim 17 wherein the first voltage rail is a continuous power supply voltage rail, the second voltage rail is a reference voltage rail, and the third voltage rail is for receiving a less positive voltage than the first voltage rail receives during the low power mode.

19. The circuit of claim 17 wherein the first voltage rail is a continuous power supply voltage rail, the second voltage rail is a continuous reference voltage rail, and the third voltage rail is for receiving a more positive voltage than the first voltage rail receives during the low power mode.

20. The circuit of claim 17 wherein the first inverting gate and the second inverting gate are each implemented with transistors having predetermined transistor channel widths and wherein a total transistor width in the second inverting gate is more than a total transistor width in the first inverting gate.

* * * * *